US010338185B2

(12) United States Patent
Rice

(10) Patent No.: US 10,338,185 B2
(45) Date of Patent: Jul. 2, 2019

(54) METHOD FOR SELF CALIBRATION OF MEASUREMENT NONLINEARITY

(71) Applicant: Keithley Instruments, Inc., Cleveland, OH (US)

(72) Inventor: Martin J. Rice, Sagamore Hills, OH (US)

(73) Assignee: Keithley Instruments, LLC, Solon, OH (US)

( * ) Notice: Subject to any disclaimer, the term of this patent is extended or adjusted under 35 U.S.C. 154(b) by 604 days.

(21) Appl. No.: 14/576,702

(22) Filed: Dec. 19, 2014

(65) Prior Publication Data

US 2016/0178721 A1    Jun. 23, 2016

(51) Int. Cl.
*G01R 35/00* (2006.01)
*G01D 18/00* (2006.01)
*H03M 1/10* (2006.01)
*G01R 13/00* (2006.01)
*G01R 19/00* (2006.01)

(52) U.S. Cl.
CPC ............ *G01R 35/005* (2013.01); *G01R 13/00* (2013.01); *G01R 19/00* (2013.01)

(58) Field of Classification Search
CPC ............... G01R 35/00; G01R 35/005; G01R 31/31922; G01R 31/3191; G01R 13/00; G01R 19/00; G01D 18/00; H03M 1/1028; H03K 13/02
USPC ............ 324/601, 130, 658, 750.02; 702/107, 702/176, 85, 89, 66
See application file for complete search history.

(56) References Cited

U.S. PATENT DOCUMENTS

| | | | | |
|---|---|---|---|---|
| 4,316,178 A * | 2/1982 | Shibayama | ......... | H03M 1/1071 341/118 |
| 4,647,907 A * | 3/1987 | Storey | ................. | H03M 1/1047 323/270 |
| 5,384,544 A * | 1/1995 | Flugstad | ............ | G01R 27/2605 324/678 |
| 6,347,541 B1 * | 2/2002 | Maleki | .................... | G01P 21/00 73/1.38 |
| 6,532,434 B1 * | 3/2003 | West | ...................... | G01D 9/005 702/187 |
| 6,763,407 B1 * | 7/2004 | Koyanagi | ............. | H03M 1/661 710/69 |
| 7,834,482 B2 * | 11/2010 | Fagg | ........................ | H03K 7/04 307/106 |

(Continued)

FOREIGN PATENT DOCUMENTS

DE        150823 A1    9/1981

OTHER PUBLICATIONS

Mai0 K et al: "An Untrimmed DAC with 14b Resolution", IEEE International Solid State Circuits Conference, IEEE Service Center, New York, pp. 24-25, Feb. 18, 1981.

(Continued)

*Primary Examiner* — Neel D Shah
(74) *Attorney, Agent, or Firm* — Miller Nash Graham & Dunn; Andrew J. Harrington

(57) ABSTRACT

A method for calibrating a test instrument having an initial output voltage level and an open output relay can include programming the test instrument for a certain current level, starting a timer, and stopping the timer (responsive to the test instrument entering compliance) to determine a time interval. The method can also include determining whether the time interval is within a desired range.

20 Claims, 5 Drawing Sheets

(56) References Cited

U.S. PATENT DOCUMENTS

| | | | |
|---|---|---|---|
| 2011/0106477 A1* | 5/2011 | Brunner | G01R 33/0035 |
| | | | 702/104 |
| 2012/0185185 A1* | 7/2012 | Bae | H04Q 9/00 |
| | | | 702/58 |
| 2015/0115858 A1* | 4/2015 | Choi | H02M 7/53873 |
| | | | 318/504 |
| 2015/0134287 A1* | 5/2015 | Ngo | G01R 35/007 |
| | | | 702/85 |

OTHER PUBLICATIONS

Extended European Search Report for European Patent Application No. 15201400.7, dated Jun. 13, 2016, 10 pages.

\* cited by examiner

METHOD FOR SELF CALIBRATION OF MEASUREMENT NONLINEARITY

TECHNICAL FIELD

This disclosure relates generally to various types of electronic instrumentation and, more particularly, to self-calibration of measurement circuitry therein.

BACKGROUND

Today's users of electronic instrumentation generally desire the measurement of either voltage or current to be highly linear over the range of the instrument (e.g., <<100 ppm over the range). Also, linearity can—and often does—drift with time and temperature, which may necessitate frequent corrections. And removing the instrument to a calibration facility or requiring external equipment is particularly undesirable.

Today's users also tend to desire having an option of making faster measurements with correspondingly lower accuracy [or slower high-resolution measurements when called for] with the same instrument.

Accordingly, a need remains for improvement in electronic instrumentation that does not affect throughput for lower resolution, high speed measurements (which is usually the case with multipoint calibration). However, while certain designs (e.g., dual converters) may begin to address this problem, the shortcomings associated therewith include increased cost with regard to board space as well as further complications to calibration traceability.

SUMMARY

Embodiments of the disclosed technology generally pertain to techniques with regard to instrument self-adjustment for fixing the linearity of the measurement circuit without relying on external references or multipoint calibration.

DETAILED DESCRIPTION

Embodiments of the disclosed technology generally include calibration of DC accuracy in a conventional manner, e.g., a regular 3-point calibration that is done typically on an annual calibration cycle.

Certain implementations may be used to acquire a set of points (e.g., nine, roughly $1/8^{th}$ of a scale apart) periodically (e.g., at the frequency chosen by the user, possibly on a monthly basis or more frequently if needed). These adjustments may be stored in the instrument's flash along with, but separately from, the DC calibration constants.

When measurements are made that will benefit from further adjustment (e.g. 1 PLC or better), the linearity adjustment may be applied to the result (e.g., after DC calibration has already been applied).

Implementations may generally be performed without any external equipment or references by the user (e.g., customer). However, one potential issue with trying to self-calibrate linearity error is the lack of a reference. The instrument's source capability would seem to be a good choice: that is, simply sweeping the source across the range of the instrument then measuring the internal feedback network would yield information about the system linearity. Unfortunately, this technique also includes linearity errors of the source (e.g., the DAC) which is typically much worse than the measurement system that is in the process of being corrected.

Among the various advantages provided by certain implementations is that the instrument generally has a stable time reference (e.g., the processor clock). Also, the instrument generally includes a current sourcing capability that extends to a low level (e.g., nano-Amps). Further, a constant current into a pure capacitance generally yields a linear voltage-versus-time (i.e., $\Delta V/\Delta t = I/C$).

Embodiments generally involve using the current source capability of the instrument into its own output capacitance to measure the cardinal points of the measurement circuit, which may advantageously eliminate source linearity from polluting the process because the source is not changing during the procedure. The current source typically does not need to be calibrated for this to work but there may be certain challenges.

Figure 1A:
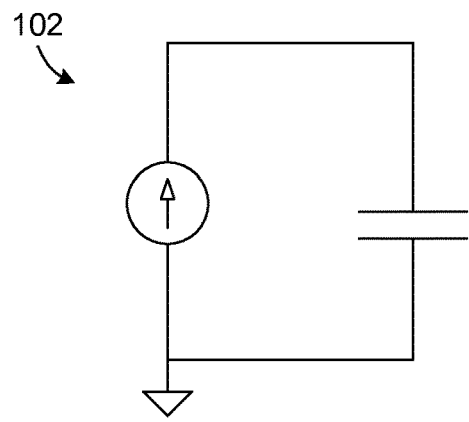
FIG. 1A illustrates an example of an ideal capacitance circuit.
Figure 1B:
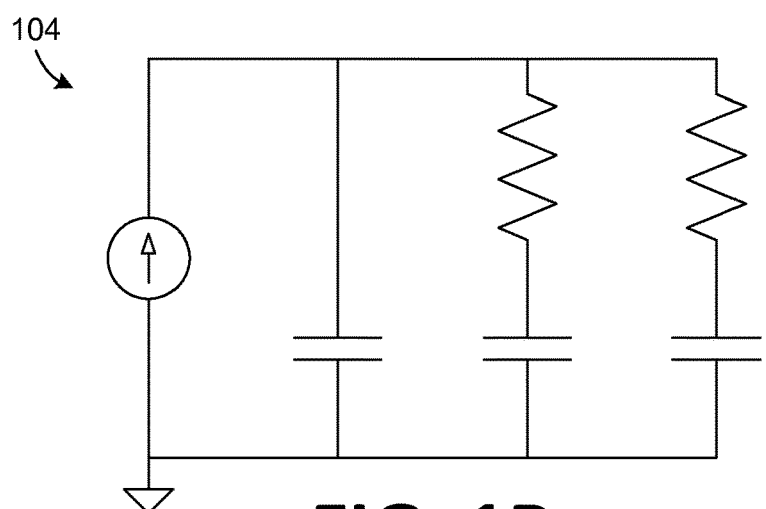
FIG. 1B illustrates an example of a non-ideal capacitance circuit.
Figure 1C:
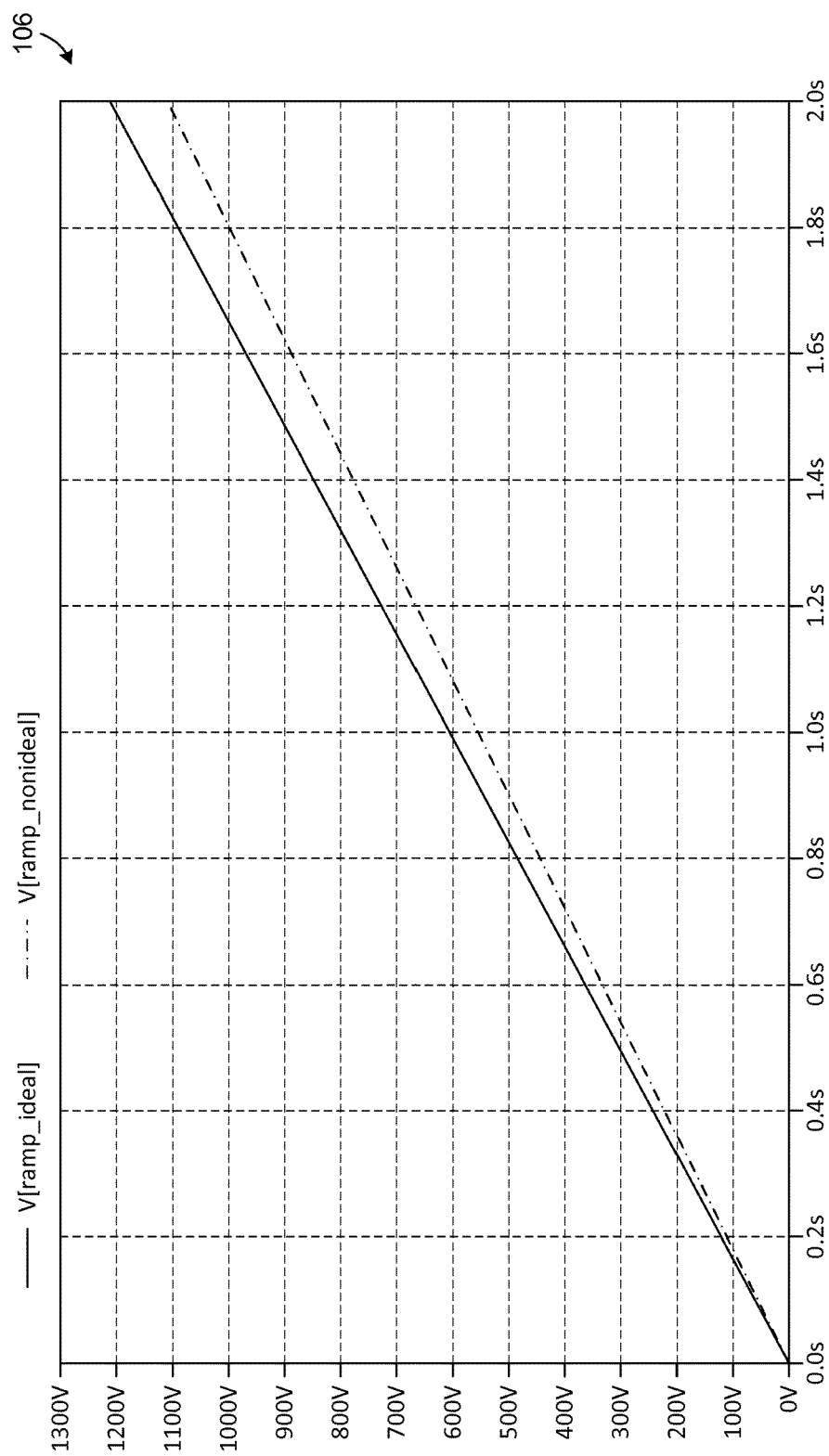
FIG. 1C is a graphical illustration of the voltage ramps corresponding to the ideal capacitance circuit and the non-ideal capacitance circuit illustrated by FIGS. 1A and 1B, respectively.

As used herein, Dielectric Absorption (DA) generally refers to the non-ideal way that the output capacitance of a circuit behaves due to the absorption of charge through materials that have a high relative permittivity (e.g., with respect to air). These dielectrics can be part of the capacitors themselves or the printed circuit board (PCB) on which the capacitor is soldered. DA may be modeled as a series of parasitic elements in parallel with the ideal capacitance that is charging. FIG. 1A illustrates an example of an ideal capacitance circuit 102, FIG. 1B illustrates an example of a non-ideal capacitance circuit 104, and FIG. 1C is a graphical illustration 106 of the voltage ramps corresponding to the ideal capacitance circuit 102 and the non-ideal capacitance circuit 104.

No matter the cause, the effect of DA is generally to make the voltage ramp during constant-current output not linear, frustrating efforts to obtain linearity information about the measurement circuits. Another source of error requiring correction is integral nonlinearity (INL) by A/D converters or amplifiers within the test instrument, for example.

However, nonlinearity due to DA or INL has been observed to be symmetrical with respect to the direction of current flow. That is, if the current ramp is repeated at the same rate and opposite polarity, the differential voltage measured across the effective output impedance will largely discard nonlinearities that are due to DA while maintaining the nonlinearity due to the measurement circuit.

Figure 2:
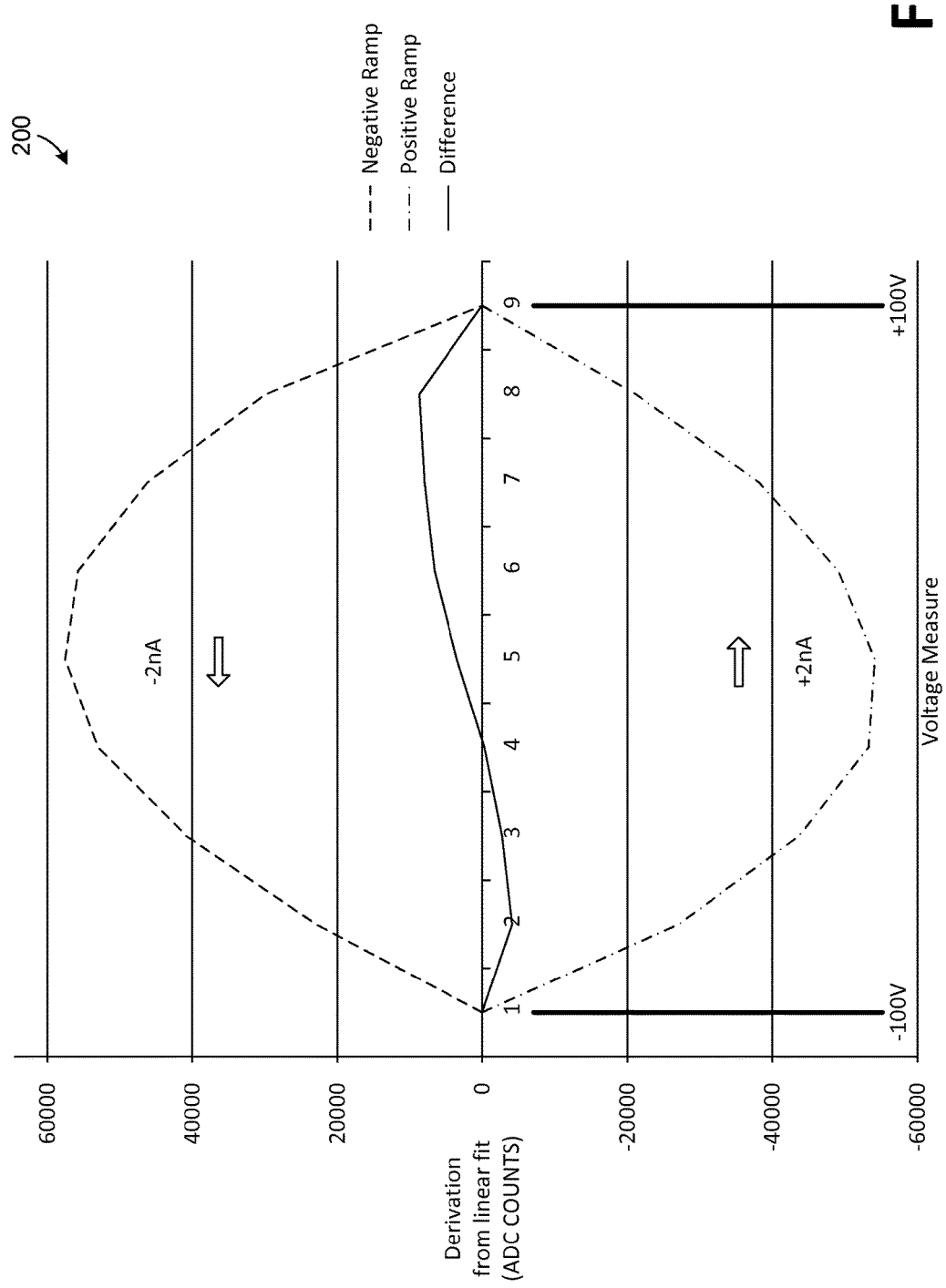
FIG. 2 is a graphical illustration of the linearity self-adjust rejection of the dielectric absorption (DA) effect.
Figure 4:
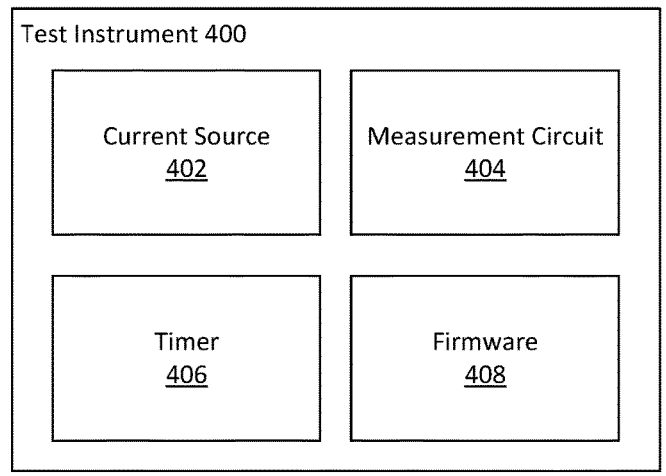
FIG. 4 depicts an example test instrument in accordance with various embodiments of this disclosure.

FIG. 2 is a graphical illustration. 200 of the linearity self-adjust rejection of the DA effect. The output capacitance and current source, e.g., current source 402 of FIG. 4, accuracy are both typically highly variable. That is, the ramp rate seen by the measurement circuit, e.g., measurement circuit 404 of FIG. 4, may vary significantly. For self-calibration to be effective, the nine cardinal points in the graph 200 need to be approximately evenly spaced from negative (−) full scale to positive (+) full scale. To accomplish this, the self-calibration algorithm may include a timing phase at the beginning.

The algorithm may begin with the output at 0V and the output relay of the instrument open. The instrument, e.g., test instrument 400 of FIG. 4, may then be programmed for a small negative current (e.g., approx. −2 nA), and a timer, e.g., timer 406 of FIG. 4, may begin. Once the instrument enters a certain voltage limit, the timer may be stopped. If the time measured is outside the range desired for the procedure (which is typically determined by the DA issue and the speed of the instrument's acquisition) then the instrument output may be reset to 0V and the current level may be adjusted. This may be repeated as necessary.

Once the current level has been adjusted and the timing is known, the instrument may perform two sweeps. Firstly, beginning at the negative (−) full scale (i.e., −100V in the example), the current source may be programmed for the chosen level, with positive polarity. The instrument firmware, e.g., firmware 408 of FIG. 4, may measure the voltage at the time interval identified, resulting in nine cardinal points.

Secondly, now at the positive (+) full scale (i.e., +100V in the example), the current source polarity may be reversed and the same—or comparable—procedure may be used to acquire nine more cardinal points. The second array may be reversed and then subtracted from the first. The resulting array of points may be used to extract a linearity factor for the measurement circuit (e.g., meaning that the array is "linearized" by subtracting it from an ideal straight line which begins at the first point and ends at the second point).

Once the coefficients for linearity adjustment have been acquired, they may be stored for future use. In certain implementations, application of the linearity adjustment may take approximately 15 microseconds, so it would typically only be applied to measurements where the throughput is significantly slower so that higher speed (e.g., lower resolution) measurements are not negatively impacted. For example, a 1 PLC equivalent reading generally requires 16.6 milliseconds to acquire, effectively rendering irrelevant the overhead of linearity adjustment.

Figure 3:
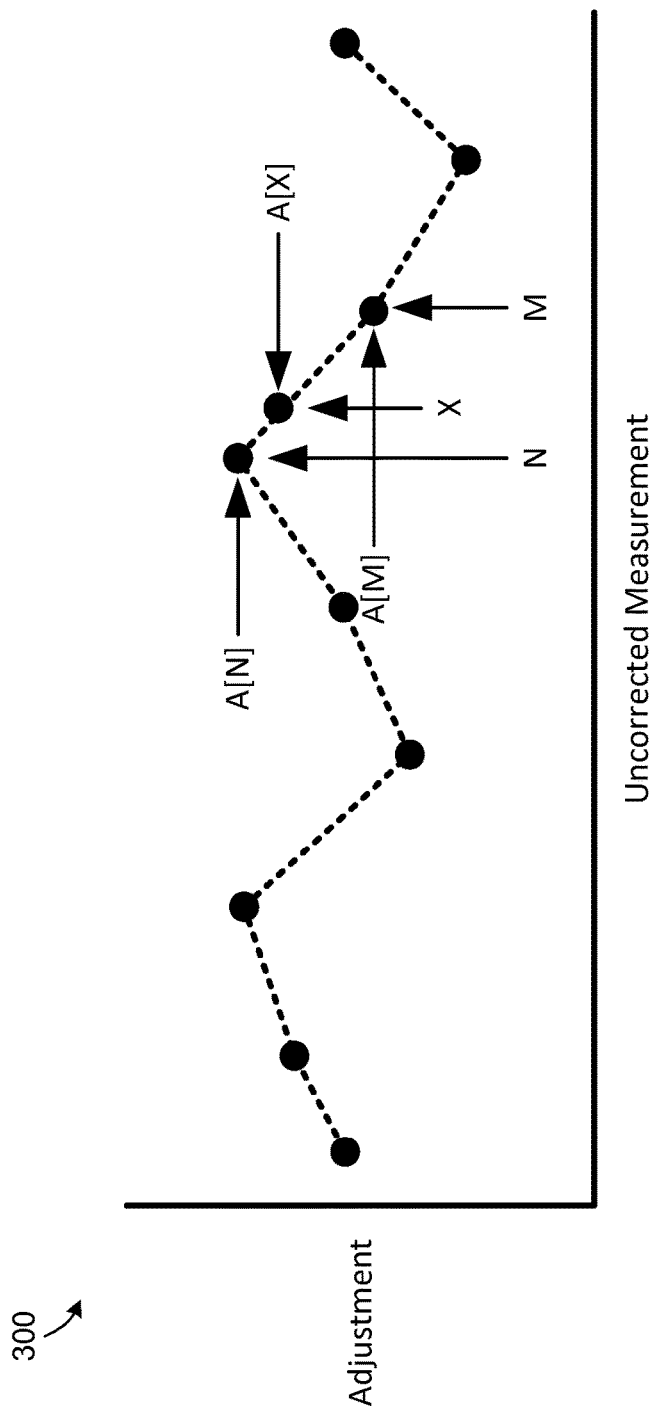
FIG. 3 is a graphical illustration of an adjustment procedure in accordance with certain embodiments of the disclosed technology.

FIG. 3 is a graphical illustration 300 of an adjustment procedure in accordance with certain embodiments of the disclosed technology. The measurement to be adjusted is typically bounded by two of the available adjustment points (e.g., which may occur at approximately $\frac{1}{8}^{th}$ scale intervals). Given that the measurement (X) in the example is between two adjustment cardinal points M and N, which have corresponding adjustment values A[M] and A[N] (e.g., the amount of non-linearity known at those points), the adjusted measurement (Y) may be calculated by linear interpolation between the two cardinal points bounding the measurement using the following:

$$A_N = A_N + (A_M - A_N) \cdot \frac{X - N}{M - N} \text{ and } Y = X + A_X.$$

It should be noted that this procedure does not rely on taking nine points and may work effectively with fewer points in certain situations or require more points in other situations. The number of points needed generally depends on the nature of the nonlinearity being corrected.

The techniques described herein may also be used to adjust current measure linearity if resources are available to route the voltage measurement information to the current measurement circuit.

Figure 5:
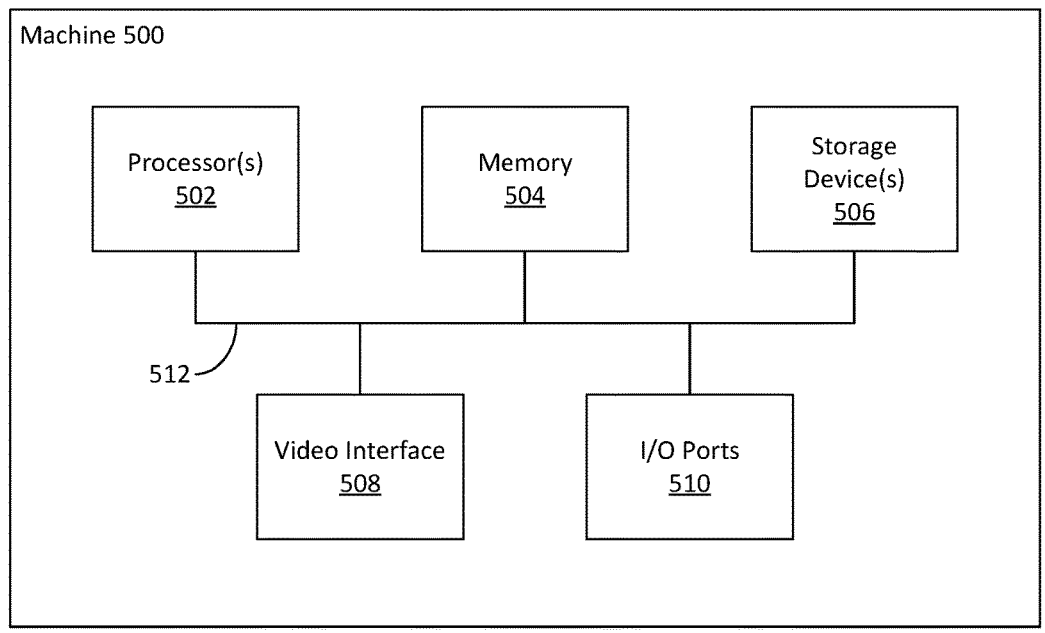
FIG. 5 depicts an example machine in accordance with various embodiments of this disclosure.

With reference to FIG. 5, typically, a machine 500 includes a system bus 512 to which processors 502; memory 504, such as random access memory (RAM), read-only memory (ROM), and other state-preserving medium; storage devices 506; a video interface 508; and input/output interface ports 510 can be attached. The machine may also include embedded controllers such as programmable or non-programmable logic devices or arrays, Application Specific Integrated Circuits (ASICs), embedded computers, smart cards, and the like. The machine may be controlled, at least in part, by input from conventional input devices such as keyboards and mice, as well as by directives received from another machine, interaction with a virtual reality (VR) environment, biometric feedback, or other pertinent input.

Typically, a machine includes a system bus to which processors, memory such as random access memory (RAM), read-only memory (ROM), and other state-preserving medium, storage devices, a video interface, and input/output interface ports can be attached. The machine may also include embedded controllers such as programmable or non-programmable logic devices or arrays, Application Specific Integrated Circuits (ASICs), embedded computers, smart cards, and the like. The machine may be controlled, at least in part, by input from conventional input devices such as keyboards and mice, as well as by directives received from another machine, interaction with a virtual reality (VR) environment, biometric feedback, or other pertinent input.

The machine may utilize one or more connections to one or more remote machines, such as through a network interface, modem, or other communicative coupling. Machines can be interconnected by way of a physical and/or logical network, such as an intranet, the Internet, local area networks, wide area networks, etc. One having ordinary skill in the art will appreciate that network communication may utilize various wired and/or wireless short range or long range carriers and protocols, including radio frequency (RF), satellite, microwave, Institute of Electrical and Electronics Engineers (IEEE) 545.11, Bluetooth, optical, infrared, cable, laser, etc.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments that are described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. A method for calibrating linearity of a measurement circuit of a test instrument comprising: determining a first set of voltage measurements of the measurement circuit while performing a first voltage sweep of the measurement circuit from a first voltage to a second voltage at an operating current level;
  determining a second set of voltage measurements of the measurement circuit while performing a second voltage sweep of the measurement circuit from the second voltage to the first voltage at the operating current level;
  calculating a linearity factor for the measurement circuit based on the first set of voltage measurements and the second set of voltage measurements; and
  storing the linearity factor to be utilized for correcting nonlinearity of future measurements performed by the measurement circuit.

2. The method of claim 1, further comprising:
  identifying the operating current level by:
    operating the measurement circuit at an initial current level;
    monitoring an interval of time that elapses for the measurement circuit to transition from a third voltage to a fourth voltage while operating at the initial current level;
    determining whether the interval of time is within a desired time range; and either:
      in response to determining that the interval of time is not within the desired time range, repetitively updating the initial current level until the interval of time is within the desired time range, and, once the interval of time is within the desired time range, setting the operating current level to the updated initial current level; or
      in response to determining that the interval of time is within the desired time range, setting the operating current level equal to the initial current level.

3. The method of claim 2, wherein the desired time range is based at least in part on dielectric absorption of the measurement circuit.

4. The method of claim 1, further comprising:
  applying the linearity factor to a measurement of the measurement circuit to correct for the nonlinearity of the measurement circuit.

5. The method of claim 1, wherein the first voltage and the second voltage are selected from the group consisting of a negative full scale voltage for the test instrument and a positive full scale voltage for the test instrument.

6. The method of claim 1, wherein individual measurements of the first set of voltage measurements and individual measurements of the second set of voltage measurements are spaced equally apart in time based on a time interval that is determined from a time period for transitioning the measurement circuit from a third voltage to a fourth voltage at the operating current level.

7. The method of claim 1, wherein calculating the linearity adjustment for the measurement circuit based on the first set of voltage measurements and the second set of voltage measurements comprises:
  reversing an order of the second set of voltage measurements;
  subtracting the individual measurements of the second set of voltage measurements from the individual measurements of the first set of voltage measurements to create a third set of voltage measurements; and
  extracting the linearity factor from the third set of voltage measurements.

8. The method of claim 1, further comprising:
  applying the linearity factor to a one or more measurements to correct for the nonlinearity of the measurement circuit based on a throughput of each measurement.

9. A test instrument comprising:
  a current source;
  a measurement circuit coupled with the current source;
  a processor coupled with the current source and the measurement circuit; and
  a memory, coupled with the processor, having instructions stored thereon, which, when executed by the processor cause the test instrument to:
    determine a first set of voltage measurements of the measurement circuit while performing a first voltage sweep of the measurement circuit from a first voltage to a second voltage at an operating current level provided by the current source;
    determine a second set of voltage measurements of the measurement circuit while performing a second voltage sweep of the measurement circuit from the second voltage to the first voltage at the operating current level provided by the current source;
    calculate a linearity factor for the measurement circuit based on the first set of voltage measurements and the second set of voltage measurements; and
    store the linearity factor to be utilized for correcting nonlinearity of future measurements performed by the measurement circuit.

10. The test instrument of claim 9, wherein the instructions further cause the test instrument to:
  identify the operating current level by:
    operating the measurement circuit at an initial current level;
    monitoring an interval of time that elapses for the measurement circuit to transition from a third voltage to a fourth voltage while operating at the initial current level;
    determining whether the interval of time is within a desired time range; and either:
      in response to determining that the interval of time is not within the desired time range, repetitively updating the initial current level until the interval of time is within the desired time range, and, once the interval of time is within the desired time range, setting the operating current level to the updated initial current level; or
      in response to determining that the interval of time is within the desired time range, setting the operating current level equal to the initial current level.

11. The test instrument of claim 10, wherein the desired time range is based at least in part on dielectric absorption of the measurement circuit.

12. The test instrument of claim 9, wherein the instructions further cause the test instrument to:
  apply the linearity factor to a measurement of the measurement circuit to correct for the nonlinearity of the measurement circuit.

13. The test instrument of claim 9, wherein the first voltage and the second voltage are selected from the group consisting of a negative full scale voltage for the test instrument and a positive full scale voltage for the test instrument.

14. The test instrument of claim 9, wherein individual measurements of the first set of voltage measurements and individual measurements of the second set of voltage measurements are spaced equally apart in time based on a time interval that is determined from a time period for transitioning the measurement circuit from a third voltage to a fourth voltage at the operating current level.

15. The test instrument of claim 9, wherein to calculate the linearity adjustment for the measurement circuit based on the first set of voltage measurements and the second set of voltage measurements the instructions cause the test instrument to:
reverse an order of the second set of voltage measurements;
subtract the individual measurements of the second set of voltage measurements from the individual measurements of the first set of voltage measurements to create a third set of voltage measurements; and
extract the linearity factor from the third set of voltage measurements.

16. The test instrument of claim 9, wherein the instructions further cause the test instrument to:
selectively apply the linearity factor to a one or more measurements to correct for the nonlinearity of the measurement circuit based on a resolution or throughput of each measurement.

17. One or more non-transitory computer-readable media having instructions stored thereon, which, when executed by a processor of a test instrument cause the test instrument to:
identify an operating current level that is capable of transitioning the measurement circuit from a first voltage to a second voltage over a time interval that is within a desired time range;
determine a first set of voltage measurements of the measurement circuit while performing a first voltage sweep of the measurement circuit from a third voltage to a fourth voltage at the operating current level;
determine a second set of voltage measurements of the measurement circuit while performing a second voltage sweep of the measurement circuit from the fourth voltage to the third voltage at the operating current level;
calculate a linearity factor for the measurement circuit based on the first set of voltage measurements and the second set of voltage measurements; and
store the linearity factor to be utilized for correcting nonlinearity of future measurements performed by the measurement circuit.

18. The one or more non-transitory computer-readable media of claim 17, wherein individual measurements of the first set of voltage measurements and individual measurements of the second set of voltage measurements are spaced substantially equally apart in time based on the time interval.

19. The one or more non-transitory computer-readable media of claim 17, wherein to calculate the linearity adjustment for the measurement circuit based on the first set of voltage measurements and the second set of voltage measurements the instructions, when executed by the processor, cause the test instrument to:
reverse an order of the second set of voltage measurements;
subtract the individual measurements of the second set of voltage measurements from the individual measurements of the first set of voltage measurements to create a third set of voltage measurements; and
extract the linearity factor from the third set of voltage measurements.

20. The one or more non-transitory computer-readable media of claim 19, wherein the instructions further cause the test instrument to:
apply the linearity factor to one or more measurements to correct for the nonlinearity of the measurement circuit by interpolating a linearity adjustment between two adjacent voltage measurements of the third set of voltage measurements.

\* \* \* \* \*